United States Patent [19]

Peterson et al.

[11] Patent Number: 5,315,793
[45] Date of Patent: May 31, 1994

[54] SYSTEM FOR PRECISION CLEANING BY JET SPRAY

[75] Inventors: Ronald V. Peterson, Thousand Oaks; Wilfried Krone-Schmidt, Fullerton, both of Calif.

[73] Assignee: Hughes Aircraft Company, Los Angeles, Calif.

[21] Appl. No.: 769,894

[22] Filed: Oct. 1, 1991

[51] Int. Cl.$^5$ .......................... B24C 3/12; B24C 1/00
[52] U.S. Cl. ........................................ 51/415; 51/426; 51/410; 51/320; 51/321
[58] Field of Search .................. 51/413, 415–417, 51/419, 421, 424–426, 317, 319–321; 134/7, 10, 12–13, 104.2–104.4, 109, 198–200

[56] References Cited

U.S. PATENT DOCUMENTS

| | | | |
|---|---|---|---|
| 1,887,395 | 11/1932 | Billings et al. | 51/421 |
| 2,276,345 | 3/1942 | Rosenberger | 51/426 X |
| 3,589,081 | 6/1971 | Kilischenko | 51/319 |
| 3,691,695 | 9/1972 | Green et al. | 51/413 |
| 4,617,064 | 10/1986 | Moore | 51/319 |
| 4,631,250 | 12/1986 | Hayashi | 134/7 X |
| 4,655,847 | 4/1987 | Ichinoseki et al. | 134/7 |
| 4,806,171 | 2/1989 | Whitlock et al. | |
| 4,832,753 | 5/1989 | Cherry et al. | |
| 4,924,643 | 5/1990 | Buigez et al. | 51/320 |
| 4,936,922 | 6/1990 | Cherry | |
| 4,962,891 | 10/1990 | Layden | |
| 4,974,375 | 12/1990 | Tada et al. | 51/413 |
| 5,044,129 | 9/1991 | Olevitch | 51/319 X |
| 5,062,898 | 11/1991 | McDermott et al. | 134/7 |
| 5,063,015 | 11/1991 | Lloyd et al. | 51/320 X |
| 5,123,207 | 6/1992 | Gillis, Jr. et al. | 51/426 |
| 5,125,979 | 6/1992 | Swain | |
| 5,129,198 | 7/1992 | Kanno et al. | 51/419 X |

FOREIGN PATENT DOCUMENTS 3434163 4/1985 Fed. Rep. of Germany .
8801577 1/1990 Netherlands .

OTHER PUBLICATIONS

Layden and Wadlow, "High velocity carbon dioxide snow for cleaning vacuum system surfaces", J.Vac.Sci. Technol.A 8 (5), Sep./Oct. 1990, pp. 3881-3883.
Stuart A. Honig, "The application of dry ice to the removal of particulates from optical apparatus, spacecraft, semiconductor wafers and equipment used in contaminant free manufacturing processes" Sep. 1985.

(List continued on next page.)

Primary Examiner—Bruce M. Kisliuk
Assistant Examiner—Bo Bounkong
Attorney, Agent, or Firm—M. E. Lachman; M. W. Sales; W. K. Denson-Low

[57] ABSTRACT

A system for precision cleaning of contaminants from the surface of a substrate, such as delicate surfaces or precision parts, utilizing streams of carbon dioxide snow or other cleaning gas. The system includes an enclosed or sealed cleaning container in which at least one jet spray device is housed for directing a stream of cleaning snow against the surface to be cleaned. During cleaning, the cleaning container holding the substrate to be cleaned is maintained under a vacuum or, optionally, at ambient pressure, filled with a clean dry gas. The dislodged contaminants and spent snow are removed from the cleaning zone and disposed of or recycled. Cleaning is accomplished by pulsed application of the cleaning snow in combination with intermittent or continuous heating of the surface so that the surface is at an elevated temperature prior to and during each application of cleaning snow. The jet spray devices which are utilized in the system are oriented so that the cleaning snow streams contact planar surfaces at grazing angles of 5 to 45 degrees. When non-planar parts are being cleaned, the jet spray devices are adjusted to provide an angle of about 45 to 90 degrees. Monitoring of the cleanliness of the parts is accomplished during the cleaning process, by a light scatter method or by a particle monitor and residual gas analysis of the exhaust gas or other analysis of the exhaust gas. The system is particularly useful in removing contaminants from the delicate surfaces or precision parts which are utilized in precision optical and electronic devices.

17 Claims, 2 Drawing Sheets

OTHER PUBLICATIONS

Ronald C. Loveridge, "CO$_2$ Jet Spray Cleaning of IR Thin Film Coated Optics," SPIE 36th international symposium on optical and optoelectronic applied science and engineering, Jul. 1991.

R. V. Peterson, C. W. Bowers, "Contamination Removal by CO$_2$ Jet Spray", SPIE, vol. 1329, Optical System Contamination, Effects, Measurements, Control II, 1990.

R. Sherman, W. H. Whitlock, "The Removal of Hydrocarbons and Silicon Grease Stains from Silicon Wafers," Journal of Vacuum Science Technology, B8 (3) May/Jun. 1990.

R. Zito, "Cleaning Large Optics with CO$_2$Snow," SPIE, vol. 1236, Advanced Technology Optical Telescopes IV, 1990.

SYSTEM FOR PRECISION CLEANING BY JET SPRAY

BACKGROUND OF THE INVENTION

1. Field of the Invention

The present invention relates generally to systems and methods for use in the precision cleaning of substrate surfaces, such as delicate surfaces and precision parts. More particularly, the present invention relates to an improved system for removing trace contaminants from the surface of a substrate, such as delicate surfaces or precision hardware, for example, those found in high sensitivity optical, electronic and precision mechanical equipment.

2. Description of Related Art

It is essential that the delicate and precision surfaces of optical-mechanical-electronic equipment be contaminant-free. For example, infrared optical sensor systems use thin film optical coatings to enhance in-band transmittance and reject out-of-band radiation. Even trace amounts of contamination degrade spectral performance by scattering, absorbing, or reflecting incident radiation.

The particulate and molecular contaminants present on optical surfaces can cause problems by changing emittance characteristics thereby increasing thermal noise in optical devices. Dust and debris contamination present on a detector surface may also generate clutter and the appearance of false targets. Further, the presence of molecular contaminants on precision optical equipment surfaces, such as lenses, windows and optical filters, results in the absorption and scatter of incident energy with the resultant decrease in system quality. In addition, in precision computer and gyroscope equipment, particle contamination in a moving disk drive or in a spinning gyroscope stator may damage or disable such a system beyond repair.

A wide variety of cleaning solvents and solutions, such as chlorofluorocarbons and ketones, have been utilized to clean delicate surfaces. However, the majority of these cleaning solutions and solvents are environmentally hazardous. In response to these environmental concerns, a number of environmentally safe cleaning materials have been proposed. One particular cleaning material which has been investigated is carbon dioxide. A variety of investigators have reported cleaning various parts utilizing a stream or jet spray of carbon dioxide. The jet stream of carbon dioxide, also known as "dry ice snow", has been used to remove light oils and particulate contaminants from surfaces. Such carbon dioxide jet sprays have been used to clean contaminants from a variety of surfaces including silicon wafers, telescope mirrors and thin film optical coatings.

The use of carbon dioxide snow to clean delicate surfaces has shown promise. However, as with any new cleaning system, there is a continual need to further develop and improve upon existing systems and procedures. For example, many of the contaminants removed from delicate or precision surfaces during carbon dioxide cleaning contain highly toxic or radioactive materials such as selenium, arsenic, cadmium, thorium and beryllium. There are numerous other organic and inorganic materials and dusts which must be removed from delicate and precision surfaces and which are toxic and unsafe. It is important that these types of contaminants be prevented from escaping into the environment during the cleaning process.

Another area which is in need of continual improvement involves increasing the efficiency of the carbon dioxide cleaning process while at the same time preventing or reducing damage to delicate surfaces. There is also a continuing need to provide improved systems and methods which are capable of utilizing carbon dioxide snow and snow produced by other gases in an efficient manner to provide ultra-cleaning of a wide variety of different contaminants from delicate and precision surfaces. Such systems should not only be versatile and efficient, but should also be capable of preventing the escape of toxic contaminants into the environment. Finally, continued improvement of carbon dioxide cleaning processes requires that a means be provided to monitor the effectiveness of the cleaning process to determine when the part has been adequately cleaned so that the cleaning process can be terminated.

SUMMARY OF THE INVENTION

In accordance with the present invention, a system for precision cleaning of contaminants from the surface of a chosen substrate, such as precision, delicate or difficult to clean surfaces, is provided which efficiently removes contaminants from these surfaces. The system also provides for the recovery of contaminants once they are removed from the surface.

The present invention is based upon a system which includes a cleaning container which provides an enclosed cleaning zone. At least one jet spray device is located within the cleaning zone for directing a stream of cleaning snow onto the surface to be cleaned. The precision, delicate or difficult to clean surface is mounted on a stage during the cleaning process. The contaminants dislodged from the surface, along with spent cleaning snow, are removed from the cleaning zone.

As a feature of the present invention, the contaminants are separated from the cleaning snow and recovered for disposal as a toxic waste or pollutant. The spent cleaning snow which is removed from the cleaning zone is either exhausted to the atmosphere or recycled back to the system for use in forming additional cleaning snow.

As a further feature of the present invention, the cleaning snow is applied to the surface as a pulsating stream. The use of pulsed applications of the cleaning snow provides improved dislodgement and removal of both inorganic and organic contaminants from the delicate or precision surface.

As another feature of the present invention, the surface is maintained at an elevated temperature prior to and during application of the snow stream to enhance contaminant removal. The rapid decrease in temperature which accompanies the application of the snow stream may also enhance removal of the contaminants. As a further feature, the present invention provides for the intermittent or continuous heating of the surface between pulsed applications of the snow stream in order to further enhance contaminant removal.

As yet another feature of the present invention, the snow stream is directed against substantially planar surfaces at grazing angles of between about 5 to 45 degrees. The application of the snow stream at such grazing angles provides for enhanced and efficient contaminant removal. With respect to non-planar surfaces, the grazing angle of the snow stream with respect to the surface is more efficient at angles of about 45 to 90 degrees.

As a further feature of the present invention, the cleanliness of the part being cleaned can be monitored or assessed by a contamination monitor. In one embodiment, the surface cleanliness of the part is interrogated using a light scatter or similar method. In other embodiments, the cleaning gas effluent is interrogated for the presence of contaminant particles or monitored by a residual gas analyzer, particle flux monitor, quartz crystal microbalance, or ultraviolet or infrared spectrophotometry.

The above features and many other attendant advantages of the present invention will become better understood by reference to the following detailed description when taken in conjunction with the accompanying drawings.

DESCRIPTION OF PREFERRED EMBODIMENTS

The system of the present invention is designed for cleaning contaminants from the surface of a chosen substrate, such as delicate or precision surfaces which are typically utilized in precision optical, electro-optical and electronic equipment and precision hardware. Although the principal use for the system is in removing trace amounts of contaminants from optical surfaces and critical electronic surfaces, the system of the present invention may also be utilized for other cleaning applications, to remove contaminants from other substrates, such as precision hardware.

The size of contaminant particles and compounds which can be removed utilizing the system of the present invention are generally on the order of submicrons to hundreds of microns in diameter. Molecular film contaminants which can be removed by the present invention are generally on the order of a few angstroms to several microns thick. Contaminants which can be cleaned by the system include particulates such as beryllium, cadmium, arsenic, selenium, chromium and uranium and their oxides or salts which are many times present in optical systems. Other toxic contaminants, including organic oils, inorganic dusts, and the like, are amenable to cleaning utilizing the system of the present invention. The system is not designed to provide cleaning of very large amounts of contaminants from surfaces. Instead, the system is intended for use as a final cleaning step to provide the ultra-clean surfaces (i.e. "precision cleaning") which are required in high precision optical and electronic equipment and precision hardware.

The following detailed description will be directed to a system utilizing carbon dioxide snow for cleaning thin film optical surfaces. However, it will be understood by those skilled in the art that the present invention has much wider application and may be used to clean delicate precision surfaces in general, including those utilized in non-optical systems, as well as any other surfaces or structures requiring high levels of cleanliness or precision cleaning. For example, the present invention may be used to clean surfaces prior to painting or bonding, where contaminants must be removed without damaging the cleaned surface. Furthermore, the present invention is not limited to the use of carbon dioxide, but can use as the cleaning gas any chemical material that exists in the gas, liquid and solid states which can be formed into a snow, including, but not limited to, nitrogen, argon, and neon.

Figure 1:
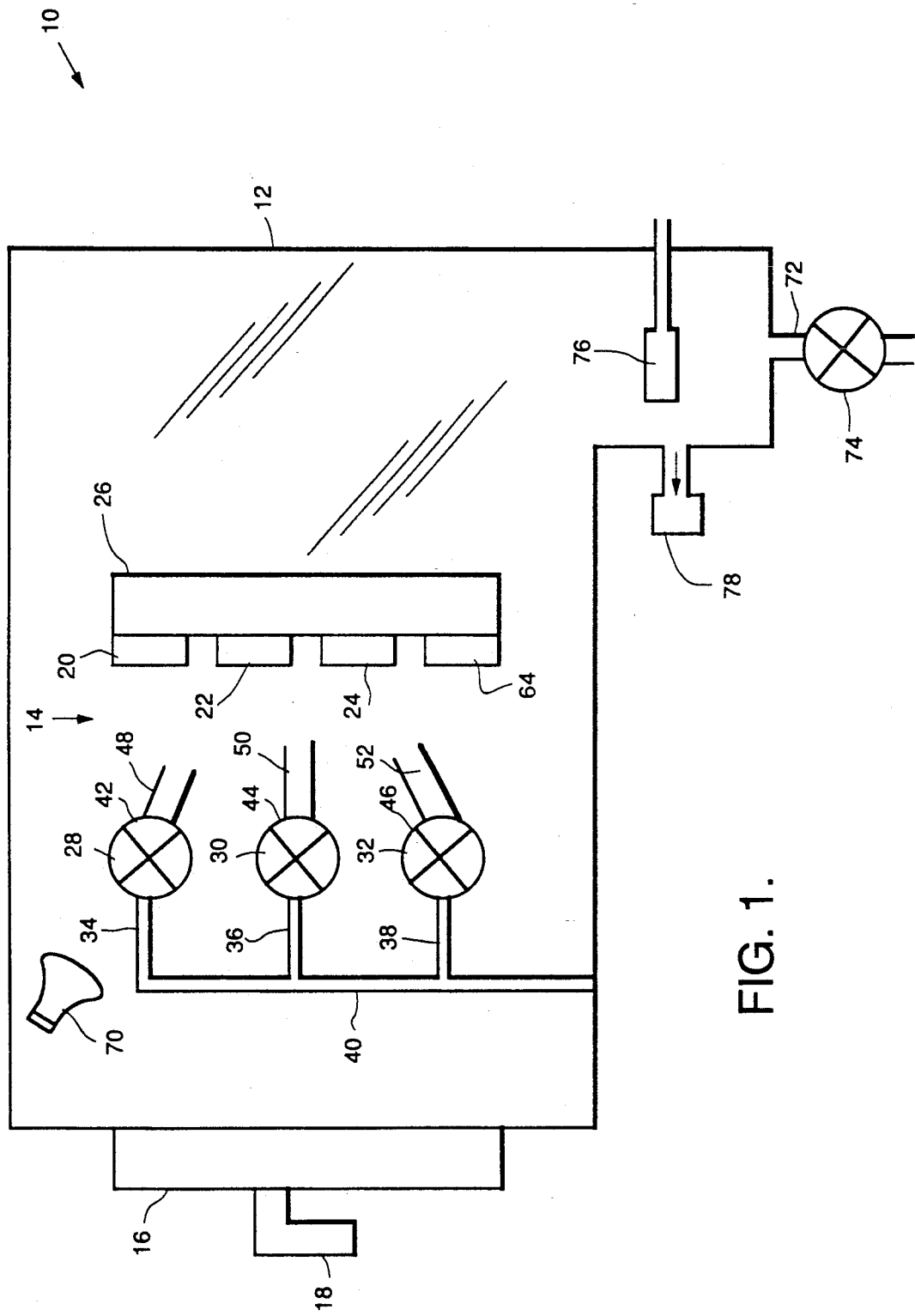
FIG. 1 is a partially schematic representation of a preferred exemplary precision cleaning system in accordance with the present invention.

A preferred exemplary precision cleaning system is shown generally at 10 in FIG. 1. The system includes a cleaning container 12 which defines an enclosed or sealed cleaning zone 14. The cleaning zone 14 encloses the system components described below. Optionally, the cleaning zone may be appropriately sealed so that a vacuum may be drawn as described below. The cleaning container 12 has an access door 16 which includes a handle 18 to provide access into the container 12 for inserting parts to be cleaned. The access door 16 also allows access into the cleaning zone 14 when maintenance or other work needs to be done on the various system parts located therein. The cleaning container 12 has walls which are sufficiently strong to withstand a vacuum in the cleaning zone 14 on the order of $10^{-3}$ Torr (millimeter of mercury) or less, if such is required. As will be discussed below, it is preferred that a vacuum or partial vacuum be pulled within cleaning zone 14 during the cleaning process.

The parts to be cleaned 20, 22 and 24 are mounted on a stage 26 or other mounting device or holder. The stage 26 can be made from any material which is structurally strong and capable of securely holding the parts 20, 22 and 24 during application of the carbon dioxide snow stream. Preferably, the stage will be made from a metal, such as stainless steel or equivalent.

The parts 20, 22 and 24 are mounted to stage 26 by any convenient means, such as clamps, clips, or other releasable attachment devices. The parts 20, 22 and 24 each have a delicate or precision surface, or other surface to be cleaned, such as a thin optical film, which faces outward from the stage 26 for exposure to the carbon dioxide snow stream. The part may have several surfaces which can be cleaned simultaneously or sequentially by appropriate location of the jet spray nozzle in the chamber, as described in further detail below. Three dimensional cleaning of a part can be accomplished by providing an open-structured part holder and nozzles behind as well in front of the part. The carbon dioxide snow stream is provided by jet spray devices 28, 30 and 32. The jet spray devices 28, 30 and 32 include inlets 34, 36 and 38, respectively. The inlets 34, 36 and 38 receive carbon dioxide via manifold 40 which is attached to an ultra pure carbon dioxide source (not shown).

The carbon dioxide introduced into manifold 40 is preferably at least 99.99% pure. The purity of the carbon dioxide is insured by providing suitable in-line micron filters which are capable of removing impurities into the sub-micron range. Preferably, impurities having particle sizes of 0.05 microns and greater are removed by filtration. It is preferred that the carbon dioxide be rendered as pure as possible in order to reduce the amount of contamination which is inadvertently introduced onto the parts to be cleaned by the carbon dioxide jet spray.

The jet spray devices 28, 30 and 32 include valve assemblies 42, 44, and 46, respectively. The valves 42, 44 and 46 are conventional needle, metering, or solenoid valves which are commonly used to provide precise metering of gaseous materials. Nozzle outlets 48, 50 and 52 are attached to valves 42, 44 and 46 respectively. The nozzle outlets 48, 50 and 52 are directed inward toward the stage 26 toward a single or multiple location(s) to provide three carbon dioxide snow streams which converge at a single or multiple location(s).

The length and internal diameter of each nozzle outlet 48, 50 and 52 is chosen to provide optimum cleaning efficiency without sacrificing directional control. Preferably, the length of the outlet will be between about 20 millimeters(mm) to 500 millimeters in order to provide optimum directional control of the carbon dioxide snow streams without losing cleaning efficiency. Preferred internal diameters are from between 3 to 13 mm. The ends of the outlets adjacent to the parts to be cleaned are preferably located no more than 500 millimeters away from the surface to be cleaned. Location of the outlets between about 10 to 250 millimeters from the surface to be cleaned is preferred for optimum cleaning.

The use of carbon dioxide to produce jet sprays or streams containing entrained carbon dioxide gas particles is known. The formation and use of such snow streams is disclosed in the following articles R. V. Peterson, C. W. Bowers, "Contamination Removal By $CO_2$ Jet Spray," SPIE, Volume 1329, Optical System Contamination, Effects, Measurements, Control II, 1990; L. Layden, D. Wadlow, "High Velocity Carbon Dioxide Snow For Cleaning Vacuum System Surfaces," Journal of Vacuum Science Technology, A8 (5), September/October 1990; R. Sherman, W. H. Whitlock, "The Removal of Hydrocarbons and Silicon Grease Stains From Silicon Wafers," Journal of Vacuum Science Technology, B8 (3) May/June 1990; R. Zito, "Cleaning Large Optics With $CO_2$ Snow," SPIE, Volume 1236, Advanced Technology Optical Telescopes IV, 1990. To form a carbon dioxide jet spray, liquid carbon dioxide from a cylinder is expanded through a device which has an orifice and a nozzle. Rapid expansion of the carbon dioxide liquid causes the formation of fine particles of solid $CO_2$ which become entrained in the carbon dioxide gas. The size of the orifice and the nozzle configuration are adjusted to obtain the desired $CO_2$ snow. With this configuration, a jet of high velocity snowflakes is produced and directed at the surface to be cleaned.

The temperature and pressure of the carbon dioxide entering jet spray devices 28, 30 and 32 from manifold 40 are all controlled in accordance with the above prior teachings regarding the formation of carbon dioxide snow. These conditions are controlled to produce a snow cleaning stream which exits nozzle outlets 48, 50 and 52 for cleaning contact with parts 20, 22 and 24.

The carbon dioxide is preferably maintained at pressures on the order of 850 pounds per square inch (58.6 bar) prior to entering the snow forming jet spray devices 28, 30 and 32. The velocity of the stream of cleaning snow may be varied depending upon the type of surface being cleaned and the amount of contaminants present. Preferably, the velocity will be adjusted to achieve maximum cleaning efficiency while causing minimal surface damage. Stream velocities on the order of 0.5 meters per second to 10 meters per second are generally suitable for removing most common contaminants from thin film optical materials. The particle sizes of the carbon dioxide ice entrained in the snow stream also can be varied depending upon the surface to be cleaned and the contaminants to be removed. For most applications, particle sizes for the carbon dioxide ice will be on the order of 1 micron to 100 microns.

The stage 26 is preferably movable within the cleaning zone 14 so that the different parts 20, 22 and 24 may be moved into position at the apex or intersection of the snow streams produced by jet spray devices 28, 30 and 32.

Figure 2:
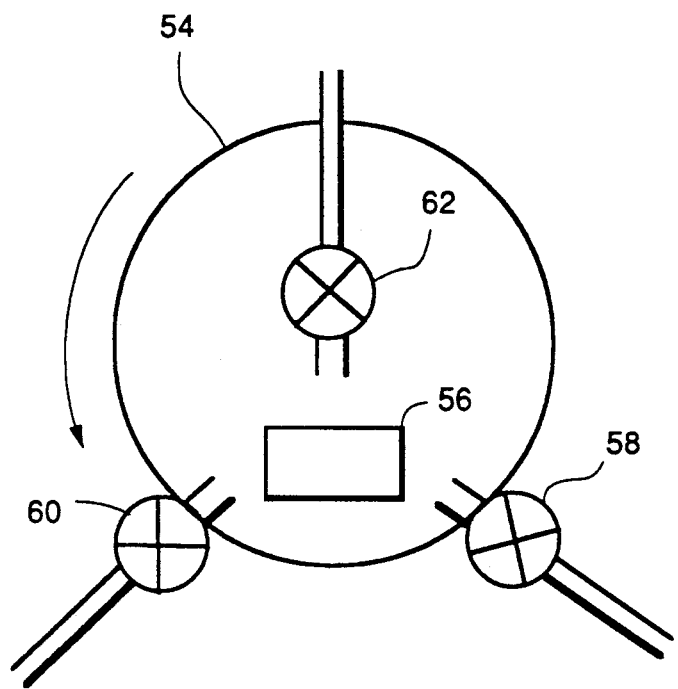
FIG. 2 is a partially schematic front view of a preferred exemplary multiple jet spray device configuration in accordance with the present invention.
Figure 3:
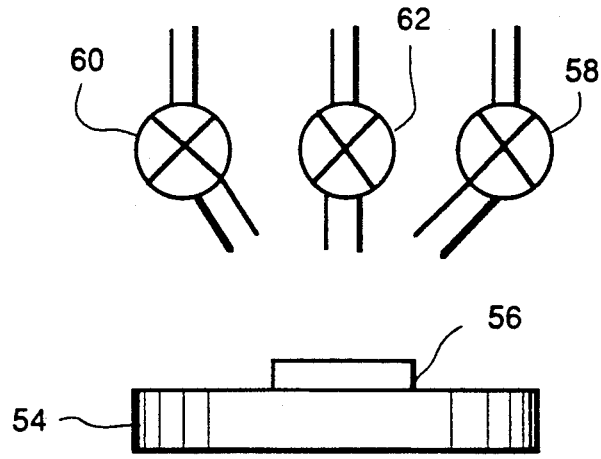
FIG. 3 is top view of the preferred exemplary jet spray device arrangement shown in FIG. 2.

A preferred exemplary jet spray device and stage arrangement is shown in FIGS. 2 and 3. FIG. 2 is a front view which looks into on a circular stage 54 upon which is mounted a part 56 having an upper thin optical film to be cleaned. The stage 54 is rotatable about a central point so that part 56 can be repeatedly exposed to the carbon dioxide streams by rotation of the stage 54. The nozzle outlets 58, 60 and 62 are preferably focused on a single cleaning location. In FIGS. 2 and 3, the part 56 is shown located at this central cleaning location or focal point. FIG. 3 is a top view of the arrangement shown in FIG. 2.

In accordance with the present invention, the cleaning efficiency of the system is optimized by a pulsed or on-off application of the snow streams to the surface to be cleaned. One way to apply a pulsed stream is to hold the part stationary and operate the various valves between open and closed positions to provide pulsing of the snow stream. The preferred method, however, is to rotate the stage 54 (shown in FIGS. 2 and 3) so that the part 56 is repeatedly rotated past the focal point of the carbon dioxide snow streams.

Preferably, the application of the $CO_2$ stream will last from one-half to two seconds with a resting period of 2 or 3 seconds or more between snow stream exposure. The part 56 remains on the rotating stage 54 for a sufficient number of pulsed applications of snow streams to insure complete removal of contaminants. A contaminant monitor, such as a light scatter detector 64 (shown in FIG. 1) is provided to measure the cleanliness of the jet sprayed surface by measuring scatter of the reflective substrate surface. Pulsed cleaning of the part continues until the scatter monitor 64 verifies that no further contaminants are dislodged from the surface being cleaned or that the desired cleaning requirements have been met.

The temperature of the surface to be cleaned is preferably maintained at a temperature well above the temperature of the carbon dioxide snow stream. Preferably, the elevated temperature at which the surface is maintained is around room temperature. A heater, such as infrared heater 70, may be used to provide heating of the parts. Alternatively, a heating element may be placed within the stage 26 to provide direct contact heating of the parts. The use of a heating element is especially preferred when pulsed application of the snow stream is being carried out. During such pulsed applications, the parts are subjected to repeated or continuous heating between repeated applications of the snow stream. The temperature of the part is monitored by a thermocouple or similar device attached to the part, which provides input to a temperature controller attached to the heater.

The contaminants and spent carbon dioxide snow stream are removed from the cleaning zone 14 by way of exhaust duct 72. The passage of contaminants through the duct 72 is controlled by valve 74. The exhaust duct 72 is preferably connected to a vacuum apparatus (not shown) for pulling a vacuum within the cleaning zone 14. The amount of vacuum created in the cleaning zone will depend upon the particular surface being cleaned and the type of contaminants being removed. Typical vacuums applied to the cleaning zone will be on the order of 1 to 700 Torr (millimeters of mercury). In addition, exhaust duct 72 is connected to systems (not shown) for separating the contaminants from the carbon dioxide. The carbon dioxide, with contaminants removed, may then be exhausted to the atmosphere. Preferably, the carbon dioxide will be reclaimed, appropriately purified and reused in the system. In addition, contaminants which are valuable materials may be recovered by this process. Alternatively, the method of the present invention may be performed at near ambient pressure conditions. In this embodiment, the chamber is initially filled with a clean dry gas, such as air or nitrogen, and a clean dry gas purge is maintained in the chamber during and following the jet spray cleaning process. A vacuum pump may be used to assist in gas evacuation. The exhaust gas may be filtered and recovered or exhausted to the atmosphere.

A detector 76 is provided for monitoring molecular contamination in the exhaust gas exiting the system through the exhaust duct 72. For example, a particle detector may be used to monitor the amount and size of particles in the exhaust gas. This particle detector or particle flux monitor provides information which is the basis for determining when the part is clean, namely, when the particles detected are sufficiently small or few in number that the desired cleanliness requirements of the part are met. Further, or alternatively, an analyzer 78 is provided to analyze and measure residual molecular species in the exhaust gas. For example, a residual gas analyzer may be used to determine the amount of vaporous contaminants which are entrained in the spent carbon dioxide stream. Such particle detectors and residual gas analyzers are commercially available, for example, from High Yield Technologies, Inc. of Mountainview, Calif. and RGA Spectramass of Laguna Hills, Calif., respectively. The particle detector 76 and residual gas analyzer 78 are used separately or in conjunction to continually monitor the impurities present in the gas as it exits the system through conduit 72. Other detector systems, such as a quartz crystal microbalance, gas chromatography, or ultraviolet or infrared spectrophotometry, may be used to analyze and measure molecular contamination, or residual molecular species, in the exhaust gas. When the exiting gas is relatively pure, it may be exhausted directly to the atmosphere or recycled into the system. However, when contaminants are present, the gas must first be processed through suitable separating equipment to remove the contaminants from the carbon dioxide. The removal of contaminants is essential when toxic contaminants such as beryllium, heavy metals or toxic organic materials are being cleaned from the parts.

The cleaning of precision machined or delicate planar surfaces is preferably accomplished by orienting the nozzle outlets so that the carbon dioxide snow stream contacts the surface at grazing angles of about 5 to 45 degrees. Best cleaning is usually accomplished when the grazing angle at which the snow stream contacts the planar surface is between about 5 to 10 degrees. With respect to non-planar surfaces, such as surfaces with protrusions or holes or odd-shaped parts, it is preferred that the grazing angle be increased to approximately 45 to 90 degrees. This near-perpendicular or perpendicular orientation of the cleaning stream with respect to the part surface insures penetration into crevices, holes and other interruptions in an otherwise planar surface. The preferred grazing angles for planar surfaces are not well suited for cleaning non-planar surface irregularities.

The system of the present invention is well suited for use in cleaning surfaces on parts which are designed for use at cryogenic temperatures. When cleaning such parts, nitrogen, argon or neon may be utilized in place of carbon dioxide. The use of carbon dioxide, is preferred because of its relatively low cost in comparison to the other gases, especially neon, and the environmentally desirable properties of carbon dioxide.

Examples of practice are as follows.

EXAMPLE

This example illustrates the use of the system and method of the present invention to precision clean metal coated mirrors.

The parts to be cleaned were 2 inch (5.08 cm) diameter metal coated mirrors that were to be incorporated into an optical system. The parts had a small amount of dust and molecular film on the surface that is detrimental to system operation. The contaminants needed to be removed without damaging the surface and without having any moisture condensing on the highly polished sensitive surface.

The parts were mounted on a holder disc in the cleaning chamber of a system of the type shown in FIG. 1 and were cleaned as previously described herein. The chamber was evacuated with a Roots blower or similar device. An infrared source in the chamber warmed the samples to 35° C. to facilitate molecular film removal. The samples were slowly spun (mounted on the disc holder) at about 20–60 revolutions per minute.

The $CO_2$ jet spray was directed onto the samples through 3 nozzles in a configuration similar to that shown in FIG. 2, so that all contaminants were removed. The jet spray was pulsed for a fraction of a second to several seconds, with a fraction of a second to a few seconds off between jet sprays. The velocity of the spray was about 1 meter per second and the exhaust gas particle monitor (obtained from High Yield Technologies, Inc. of Mountainview, Calif., Model No. PM-150) showed that the cleanliness requirements of the parts had been met.

The chamber was back-filled with a clean dry gas, the parts were brought back to ambient temperature, and the chamber was opened for parts removal. The cleaned parts were examined by a light microscope and a scanning electron microscope and determined to be free of contaminants.

Having thus described exemplary embodiments of the present invention, it should be noted by those skilled in the art that the disclosures within are exemplary only and that various other alternatives, adaptations and modifications may be made within the scope of the present invention. Accordingly, the present invention is not limited to the specific embodiments as illustrated herein, but is only limited by the following claims.

What is claimed is:

1. A system for precision cleaning of contaminants from a surface of a substrate comprising:
    a cleaning container having walls which define an enclosed cleaning zone;
    at least one jet spray device located within said enclosed cleaning zone and having an inlet and an outlet;
    means for producing a stream of cleaning snow comprising a stream of gas entraining ice particles of said gas, wherein said stream is emitted from the outlet of said jet spray device;

a stage located within said enclosed cleaning zone, for holding said substrate during precision cleaning thereof;

means for directing said stream of snow from said outlet of said jet spray device onto said surface of said substrate to remove said contaminants from said surface;

means for removing contaminants and cleaning snow from said cleaning zone; and means for monitoring the extent of cleaning of contaminants from said surface during said cleaning process, said means for monitoring comprising means for detecting the amount of said contaminants exiting said cleaning zone.

2. A system for precision cleaning of contaminants from the surface of a substrate according to claim 1 wherein said stream of cleaning snow comprises carbon dioxide ice particles entrained in a gaseous stream of carbon dioxide gas.

3. A system for precision cleaning of contaminants from the surface of a substrate according to claim 1 wherein said system further includes means for heating said surface to about room temperature and means for monitoring said temperature of said surface.

4. A system for precision cleaning of contaminants from the surface of a substrate according to claim 3 wherein said system includes means for providing pulsed streams of said cleaning snow against said surface and wherein said means for heating said surface provides for reheating of said surface to said room temperature between or during said pulsed streams of said cleaning snow.

5. A system for precision cleaning of contaminants from the surface of a substrate according to claim 4 wherein said means for providing said pulsed streams includes rotation means for rotating said stage to provide repeated exposure of said surface to said stream of cleaning snow.

6. A system for precision cleaning of contaminants from the surface of a substrate according to claim 1 wherein at least three jet spray devices are provided within said cleaning zone and the stream of cleaning snow from each outlet of each said jet spray device is directed to a single cleaning location.

7. A system for precision cleaning of contaminants from the surface of a substrate according to claim 1 wherein the stream of cleaning snow from said outlet of said at least one jet spray device is directed to a single cleaning location wherein the portion of said surface at said cleaning location is substantially planar and wherein said stream of cleaning snow from said outlet is directed at said surface at a grazing angle of between about 5 to 45 degrees.

8. A system for precision cleaning of contaminants from the surface of a substrate according to claim 7 wherein the grazing angle of said stream of cleaning snow is between about 5 to 10 degrees.

9. A system for precision cleaning of contaminants from the surface of a substrate according to claim 1 wherein the steam of cleaning snow from said jet spray device is directed to a single cleaning location wherein the portion of said surface at said cleaning location is substantially non-planar and wherein said stream of cleaning snow from said jet spray device is directed at said surface at a grazing angle of between about 45 and 90 degrees.

10. A system for precision cleaning of contaminants from the surface of a substrate according to claim 1 wherein said system further includes vacuum means for providing a vacuum within said cleaning zone during said precision cleaning.

11. A system for precision cleaning of contaminants from the surface of a substrate according to claim 1 further comprising means for maintaining said cleaning zone at near ambient pressure conditions and means for purging said cleaning zone with a clean dry gas.

12. A system for precision cleaning of contaminants from the surface of a substrate according to claim 1 wherein means are provided for recycling the cleaning snow removed from said cleaning zone.

13. A system for precision cleaning of contaminants from the surface of a substrate according to claim 1 wherein means are provided for separating and recovering said contaminants from said cleaning snow removed from said cleaning zone.

14. A system for precision cleaning of contaminants from the surface of a substrate according to claim 1 wherein said cleaning snow comprises a material selected from the group consisting of nitrogen, argon, and neon.

15. A system for precision cleaning of contaminants from the surface of a substrate according to claim 1 wherein said means for detecting the amount of contaminants exiting said cleaning zone comprises means for measuring the amount and size of particles of said contaminants exiting said cleaning zone.

16. A system for precision cleaning of contaminants from the surface of a substrate according to claim 1 wherein said means for detecting the amount of contaminants exiting said cleaning zone comprises means for analyzing and measuring residual molecular species exiting said cleaning zone.

17. A system for precision cleaning of contaminants from the surface of a substrate according to claim 16 wherein said detecting the amount of contaminants exiting said cleaning zone comprises means selected from the group consisting of a residual gas analyzer, a quartz crystal microbalance, a gas chromatography system, and an infrared or ultraviolet spectrophotometer.

* * * * *